(12) United States Patent
Fannasch

(10) Patent No.: US 6,783,077 B1
(45) Date of Patent: Aug. 31, 2004

(54) CONDUCTOR TRACK SUPPORTING LAYER FOR LAMINATING INSIDE A CHIP CARD, CHIP CARD COMPRISING A CONDUCTOR TRACK SUPPORTING LAYER, AND METHOD FOR PRODUCING A CHIP CARD

(75) Inventor: Lothar Fannasch, Bielefeld (DE)

(73) Assignee: ORGA Kartensysteme GmbH, Paderborn (DE)

( * ) Notice: Subject to any disclaimer, the term of this patent is extended or adjusted under 35 U.S.C. 154(b) by 0 days.

(21) Appl. No.: 10/069,419
(22) PCT Filed: Aug. 24, 2000
(86) PCT No.: PCT/DE00/02889
§ 371 (c)(1), (2), (4) Date: Apr. 12, 2002
(87) PCT Pub. No.: WO01/17011
PCT Pub. Date: Mar. 8, 2001

(30) Foreign Application Priority Data

Aug. 26, 1999 (DE) .......................... 199 40 480

(51) Int. Cl.[7] ............................... G06K 19/06
(52) U.S. Cl. ...................... 235/492; 235/451; 235/487; 257/679; 361/737
(58) Field of Search ................. 235/492, 235, 235/487; 361/737; 257/679

(56) References Cited

U.S. PATENT DOCUMENTS 4,731,645 A 3/1988 Parmentier et al.

FOREIGN PATENT DOCUMENTS

| EP | 0 824 301 | 2/1998 |
| EP | 0 869 453 | 10/1998 |
| JP | 10-121012 | 5/1998 |

Primary Examiner—Michael G. Lee
Assistant Examiner—Ahshik Kim
(74) Attorney, Agent, or Firm—Foley & Lardner

(57) ABSTRACT

A conductor track supporting layer for laminating inside a chip card includes at least one conductor track and connecting areas that are connected to the conductor track. The conductor track is applied to the conductor track supporting layer during a screen printing method and is made of a screen printing paste. The conductor track supporting layer has indentations which are located in the area of the connecting areas and which are filled with the screen printing paste during the screen printing process. As a result, it is possible to produce conductor track supporting layers provided with connecting areas of varying thicknesses which enable the production of recesses in the chip cards, after the conductor track supporting layers are laminated in chip cards. These recesses expose the connecting i, areas for connection to electronic components. And, the sensitive strip conductors, also located in the chip card, are prevented from becoming damaged.

8 Claims, 2 Drawing Sheets

CONDUCTOR TRACK SUPPORTING LAYER FOR LAMINATING INSIDE A CHIP CARD, CHIP CARD COMPRISING A CONDUCTOR TRACK SUPPORTING LAYER, AND METHOD FOR PRODUCING A CHIP CARD

The invention relates to a conductor track supporting layer for laminating inside a chip card comprising at least one conductor track which is applied to the conductor track supporting layer by an application method, preferably a screen printing method, and consists of a screen printing paste, and comprising connecting areas which are connected to the conductor track.

Apart from the screen printing method, the stencil printing method or the use of a dispenser also comes into consideration. Apart from an electrically conductive screen printing paste, a high-viscosity, electrically conducting liquid also comes into consideration as the material to be processed.

Conductor track supporting layers of the type mentioned at the beginning are preferably used for the production of chip cards, chip cards of this type already being used in large numbers in the form of phone cards, access authorization cards for cellular phones, bank cards etc. In the prior art, applied to the conductor track supporting layers of chip cards of this type there is usually a coil, which has corresponding connecting areas and serves for the power supply and data exchange of the card with external equipment. When coils are used for power and data exchange, this exchange takes place without contact, so that it is referred to as a contactlessly operating card. Apart from contactlessly operating cards, however, there are also known chip cards in which, apart from the information transmitted through the coil, information and power can also be imparted by direct means, with contacts, through galvanically operating contact areas. The production of the conductor track supporting layer used for the aforementioned contactless cards or cards with contacts can be performed in a way corresponding to a customary process by the screen printing method. In such a production procedure, the individual conductor tracks of the coil are applied together with the connecting areas for the connection of the coil to additional electronic components arranged on the chip card, such as for example a chip module, by applying an electrically conducting screen printing paste to a plastic substrate. It is of course also possible in the course of this production method to apply in addition to the actual coil necessary conductor tracks for the use of further electronic components, such as display devices or keypads, to the conductor track supporting layer.

Once printing on it has been completed, the conductor track supporting layer is laminated in a subsequent method step with further layers of plastic, some of which may bear inscriptions, in a laminating press to form a plastic card body. After the laminating process, it is necessary to introduce clearances into the plastic card body for the chip module and/or further electronic components to be inserted, and at the same time to expose the individual connecting areas of the coil and of further conductor tracks of the conductor track supporting layer, in order to connect these connecting areas to the corresponding contact areas of the chip module and of the other components, which usually takes place by using a conductive adhesive and soldering. When the clearances are being produced, it is necessary to proceed with great care and extreme accuracy, because on the conductor track supporting layer there are usually arranged directly next to the connecting areas to be exposed also conductor tracks which must not on any account be damaged or even completely severed. Even with high precision milling tools, there is a high reject factor for chip cards due to damaged conductor tracks, since they usually have only a width of about 80 $\mu$m, whereas the corresponding connecting areas are usually of sizes of around 1 mm$^2$.

In addition, when the customary conductor track supporting layers are used, there is the problem that, when an electrically conducting connection is being established between the contact areas of the chip module or other electronic components and the connecting areas of the conductor tracks on the conductor track supporting layer by a conductive adhesive or by a solder, an electrical short-circuit can very easily be produced between individual conductor tracks, for example of the coil and the associated connecting areas, since the distance between the conductor tracks and the conductor track connections is very small. Short-circuits of this type make the conductor track supporting layer unusable. In most cases it is not possible to change the arrangement of the conductor tracks on the conductor track supporting layer to the extent that the distances between them in the region of the milled-out clearance become greater, in order to avoid a short-circuit, since the base area of the conductor track supporting layer is limited overall on account of the standardized dimensions of the chip card.

SUMMARY OF THE INVENTION

Against the background of the prior art presented, it is an object of the invention to provide a conductor track supporting layer of the type described at the beginning in which the risk of the conductor tracks being damaged by the exposure of the connecting areas connected to the conductor tracks in the course of the milling operation in the production of contactless chip cards or chip cards with contacts is ruled out in a simple and low-cost way.

This object is achieved according to the invention by the conductor track supporting layer having in the region of the connecting areas indentations which are filled with the screen printing paste during the screen printing operation.

The measure according to the invention has the effect that, after the screen printing operation, the connecting areas of the conductor track supporting layer have a significantly greater thickness than the conductor tracks. If, in the course of the production process, clearances are made in the conductor track supporting layer in the milling operation carried out after the lamination of the plastic card body of the chip card, from that side of the conductor track supporting layer on which no conductor tracks are located, the milling operation can be stopped already in good time before the conductor track level is reached, on account of the greater thickness of the connecting areas, so that damage to the sensitive conductor tracks is reliably ruled out.

With the teaching according to the invention of claim 1, further special refinements of the subject matter of the invention emerge from the features of the subclaims 1 to 7.

For the production of the conductor track supporting layer, it has proven to be advantageous in particular to make all or some of the indentations as through-holes with an opening of the on the rear side of the conductor track supporting layer, lying opposite the conductor track side of the supporting layer. By this measure, the indentations can, for example, be carried out without any problem by a low-cost punching operation. In addition, the fact that some indentations are made as through-holes and some are made as blind holes in the conductor track supporting layer has the effect of producing connecting areas of different thicknesses after the screen printing operation, and consequently of producing within a plastic card body after lamination has been completed different connecting levels for different electronic components. These different connecting levels allow the fitting of electronic components of different thicknesses, such as for example displays or keypads, so that the application possibilities of chip cards of this type, provided with different components, can be increased many times in comparison with the current state of the art.

It has additionally been found to be expedient if, before applying the conductor tracks, the conductor track supporting layer provided with through-holes is provided with a thin covering film on the rear side, remote from the conductor tracks. This covering film prevents screen printing paste from coming out through the through-holes on the rear side of the conductor track supporting layer during the subsequent screen printing operation, since the through-holes are then closed at their lower end by the covering film.

In the course of trials, it has additionally proven to be advantageous if the screen printing paste has a silver particle content of from 70 to 80 percent by volume, where the individual silver particle grain sizes should lie in the range >45 $\mu$m. The silver particle content with appropriate grain size of individual particles allows adequate electrical bonding between the components and the connecting areas to be ensured when the connecting areas of the conductor track supporting layer are subsequently exposed, even if the connecting areas are only partially exposed in the course of the milling operation.

Apart from the conductor track supporting layer according to the invention, presented above, the invention also relates to a chip card with a chip card body, a chip module arranged in a recess of the chip card body and/or electronic components arranged in further recesses, and a conductor track supporting layer, to which at least one conductor track consisting of screen printing paste and connecting areas connected to this conductor track have been applied in a screen printing method.

In the case of chip cards of this type, as already stated above, there is the risk that, during the milling out of the recesses for the chip module and/or further electronic components which are to be arranged on the chip card, not only the connecting areas of the conductor track supporting layer but also the conductor tracks arranged next to the connecting areas are damaged or even severed.

It is accordingly also an object of the present invention to provide a chip card of the generic type described above in which the mentioned problems of the prior art are eliminated, i.e. in which milling out of the recesses for the individual components to be placed in the chip card can consequently be performed in a low-cost way, without damaging the conductor tracks present on the conductor track supporting layer.

This object is achieved according to the invention by the conductor track supporting layer having in the region of the connecting areas indentations filled with screen printing paste, by the recess(es) for the chip module and/or additional electronic components being arranged on the flat side of the conductor track supporting layer not coated with the conductor track and by the recess(es) having such a depth that the bottom region reaches so far into the conductor track supporting layer that the indentations filled with screen printing paste of the conductor track supporting layer are just exposed.

Since, on account of their screen printing paste introduced into the indentations of the conductor track supporting layer, the connecting areas to be exposed for the connection of the chip module and/or the other electronic components have a very much greater thickness than the conductor tracks applied to the surface of the conductor track supporting layer, the milling-out operation for the recesses can be stopped immediately after exposure of the connecting areas, without the risk of penetrating into the cross-sectional region of the chip card in which the sensitive conductor tracks are arranged.

The invention also relates to a method for producing a chip card, comprising a multilayer plastic card body, at least one electronic component, preferably a chip module, arranged in a recess of the plastic card body, in which at least one conductor track layer and at least two covering layers covering the conductor track layer on both flat sides are arranged exactly in position one on top of the other, the card layers arranged one on top of the other are bonded to one another in a laminating press by the influence of pressure and heat, after removal of the plastic card body from the laminating press, the recess for the electronic component is milled into said body and subsequently, the component for establishing an electrical connection with the connecting areas on the conductor track supporting layer is inserted into the recess of the card body, characterized by the making of indentations into the conductor track supporting layer at the predetermined locations for the placement of the connecting areas, the coating of the conductor track supporting layer in a screen printing method with conductor tracks and with connecting areas connected to the conductor tracks consisting of screen printing paste in such a way that the screen printing paste used for the coating fills the indentations in the conductor track layer, the milling-out of the recesses for the electronic components from the outer side of the card body, which is remote from the coated side of the inner conductor track supporting layer, the recesses having such a depth that their bottom region reaches into the conductor track supporting layer and the indentations filled with screen printing paste of the conductor track supporting layer are just exposed.

The features presented in the characterizing clause of claim 9 in conjunction with the method steps already customary today for the production of a contactless chip card or chip card with contacts eliminate the previously existing difficulties, which are that, in the course of milling out the recesses for the electronic components and the associated exposure of the connecting areas of the conductor track supporting layer, the conductor tracks also present on the latter are damaged or severed.

Together with the technical teaching of claim 9, special refinements of the method according to the invention emerge from the features of claims 10 to 12.

For the method according to the invention it has proven to be advantageous in particular to simplify the method step of making indentations in the conductor track layer by making the indentations in the conductor track layer as through-holes in the course of a punching operation. To prevent the screen printing paste from coming out through the through-holes on the rear side of the conductor track supporting layer during the subsequent screen printing operation with said paste, it is additionally advantageous, as a further method step after the punching-out of the through-holes in the conductor track supporting layer, to provide the latter on one side with a covering film which closes the through-holes, so that flowing out of the screen printing paste is ruled out.

It has additionally proven to be advantageous if a plurality of sublayers provided with through-holes are coated exactly in position one on top of the other and bonded to one another to form a common conductor track supporting layer, indentations of different depths being formed in the individual sublayers by making the positions of the through-holes coincide. This method step according to the invention has the advantage that a conductor track supporting layer can be formed by allowing indentations of different depth dimensions to be formed, by for example the conductor track supporting layer being made up of three individual layers, producing three different depth dimensions of the connecting areas. The smallest depth is produced by a through-hole in only one sublayer, a medium depth is produced by the same positioning of a through-hole in two layers one on top of the other and a largest indentation is produced by positioning the through-holes in all three sublayers one on top of the other. Of course, in the case of the last-mentioned indentations, a covering film can again finally be placed on the entire conductor track supporting layer, in order to rule out flowing through of the screen printing paste in the subsequent screen printing operation.

BRIEF DESCRIPTION OF THE DRAWINGS

Exemplary embodiments concerning the conductor track supporting layer, the chip card and the method for producing the chip card are explained in more detail below on the basis of the attached drawings, in which.

DETAILED DESCRIPTION OF THE PREFERRED EMBODIMENT

Figure 1:
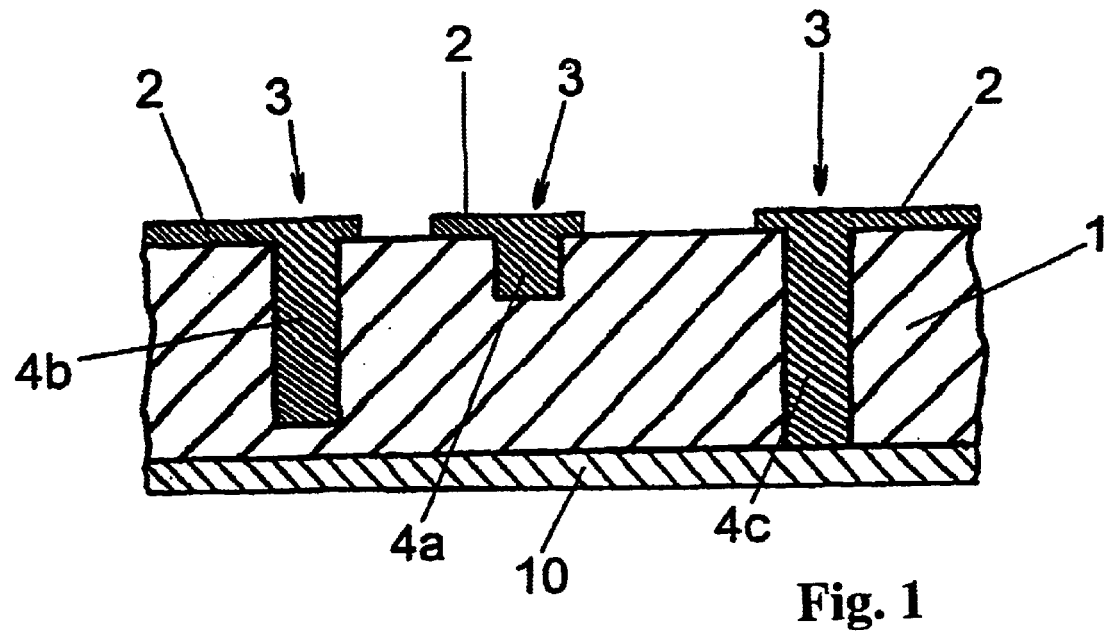
FIG. 1 shows an exemplary embodiment of the conductor track layer according to the invention in cross section.

In FIG. 1, a conductor track supporting layer 1 for laminating inside a chip card is represented, it being possible for conductor track supporting layers of this type to be supplied to the chip card producers as a semifinished product by specialist manufacturers. The conductor track supporting layer 1 represented in FIG. 1 is provided with a plurality of conductor tracks 2 which consist of a screen printing paste and have been applied to the conductor track supporting layer 1. Connected to the conductor tracks are connecting areas 3, which by contrast with the very narrow conductor tracks (width: about 85 $\mu$m) usually have a base area of 1 mm$^2$ or more. These connecting areas serve for the electrical connection of the conductor tracks 2 to electronic components, such as for example a chip module, which are necessary as necessary components for realizing the function of the card, for example as an access authorization card, phone card or the like.

It can be seen from FIG. 1 that the conductor track supporting layer 1 has in the region of the connecting areas 3 indentations 4a, 4b and 4c, which in the case of the finished conductor track supporting layer represented in FIG. 1 are completely filled with the screen printing paste of which the conductor tracks 2 also consist. In the exemplary embodiment of FIG. 1, the indentations 4a, 4b and 4c have different depths, so that the connecting areas 3 have different thicknesses.

Figure 2:
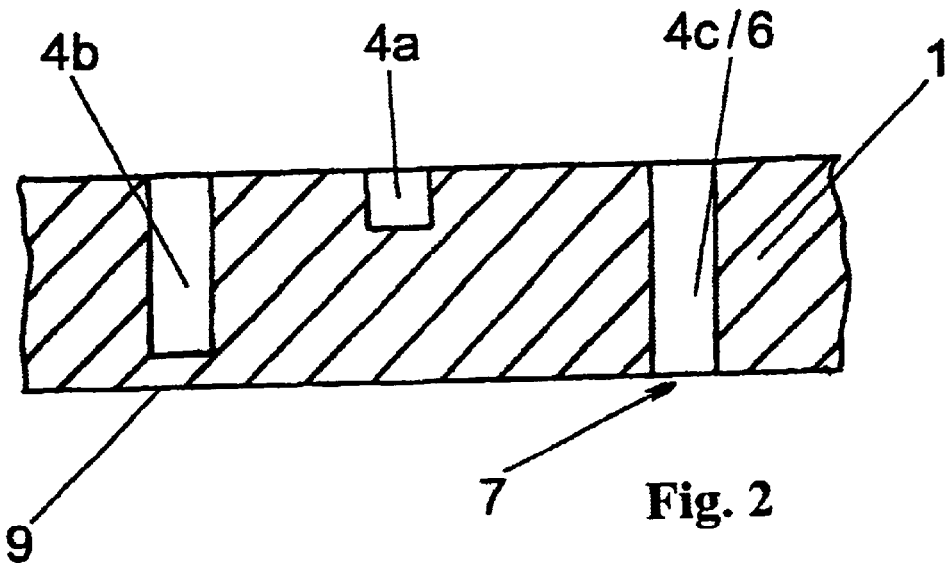
FIG. 2 shows the conductor track supporting layer from FIG. 1 before the method step of applying the screen printing paste.

In FIG. 2, the conductor track supporting layer 1 of FIG. 1 is represented once again before the screen printing paste is applied in the course of a screen printing method. It is clear from this figure, as from FIG. 1, that the indentation 4c, as a through-hole 6, cuts through the entire conductor track cross section and has an opening 7 on the rear side of the conductor track supporting layer 1. If connecting areas 3 of only one thickness are necessary for a conductor track supporting layer 1 for the intended purpose, it has proven to be particularly favorable to punch out the conductor track supporting layer 1 in the regions in which connecting areas 3 are to be arranged, so that, by analogy with the thickness of the conductor track supporting layer of from 300 to 350 mm, an overall thickness of the connecting areas 3 of from 350 to 400 $\mu$m is later obtained after applying the screen printing paste, since the conductor tracks 2 on one side of the conductor track supporting layer 1 usually have a layer thickness of 50 $\mu$m.

Figure 3:
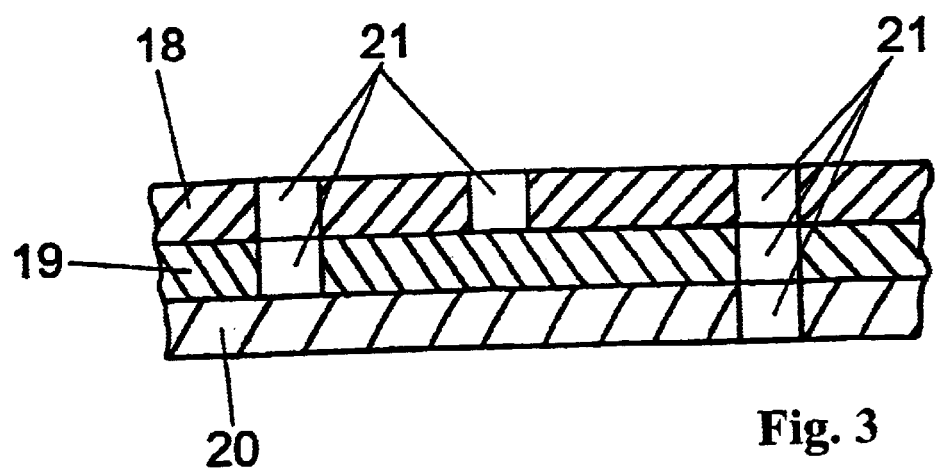
FIG. 3 shows a further exemplary embodiment of a conductor track supporting layer according to the invention in cross section before the screen printing paste is applied and FIG. 4 shows a detail of a chip card according to the invention in cross section, with a fitted chip module.

If it is necessary to provide connecting areas 3 of different thicknesses in the conductor track supporting layer, the variant of FIG. 3 offers a low-cost and easy-to-realize possible way of doing this.

FIG. 3 shows a conductor track supporting layer 1 before application of the screen printing paste analogous to FIG. 2; in the case of this embodiment, however, the overall conductor track supporting layer 1 comprises a plurality of sublayers, which are identified in FIG. 3 by 18, 19 and 20. The sublayers 18, 19 and 20 each have through-holes 21, which have been made within the outline of the conductor track supporting layer-at those locations at which connecting areas 3 are to be provided. It is clear from FIG. 3 that, after the punching-out of the through-holes 21 in the case of the individual sublayers 18, 19 and 20, the sublayers are arranged exactly in position one on top of the other. The position of the individual through-holes 21 of the individual sublayers has the effect that, when they are positioned one on top of the other, either through-holes are produced by analogy with the designation 6 or 4c of FIGS. 2 and 1 or blind holes are produced by analogy with the designations 4a and 4b from the aforementioned figures. After the individual sublayers 18, 19 and 20 have been placed one on top of the other, the sublayers are bonded to one another, so that an easy-to-handle and easy-to-coat conductor track supporting layer 1 is obtained.

To prevent the screen printing paste used in the screen printing operation from flowing through the through-holes 6 of the conductor track supporting layer 1 and coming out again on the rear side 9, this rear side 9 may be provided with a protective film 10 (see FIG. 1), which prevents the screen printing paste from running on the rear side 9 of the conductor track supporting layer 1.

The conductor tracks 2, which are applied to the conductor track supporting layer 1 in the course of the screen printing method, may, for example, have the form of a coil, which is necessary after the conductor track supporting layer 1 has been fitted into a chip card for the data exchange or power supply of the chip card with external equipment.

Figure 4:
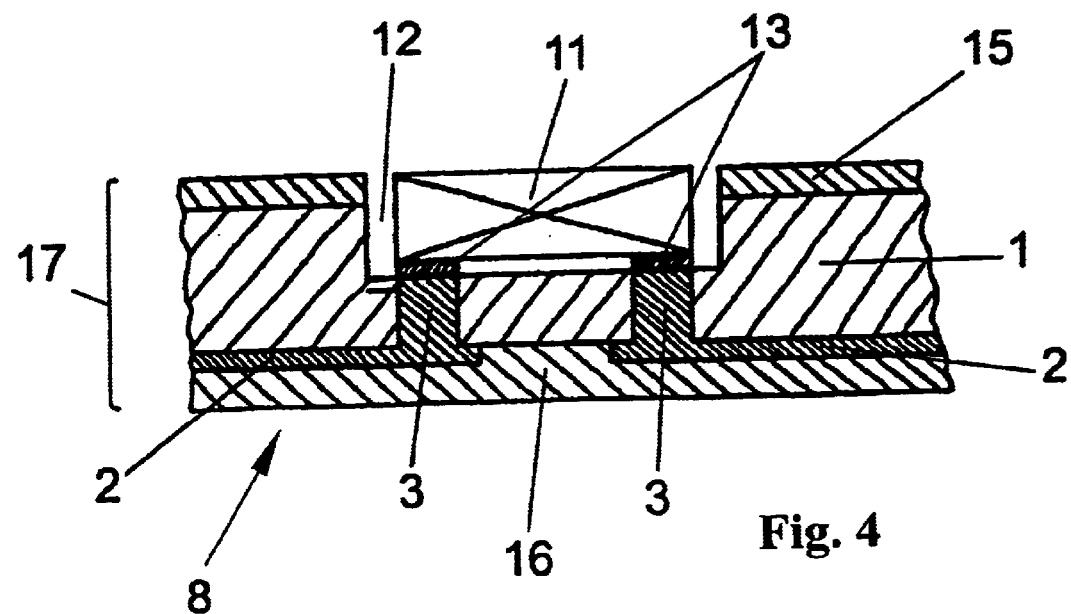

The conductor track supporting layers 1 described so far in their various forms are used after their production in chip cards with contacts or contactless chip cards. The schematic construction of a chip card 8 of this type is represented in FIG. 4. It is clear from this figure that the conductor track supporting layer 1 is located in the middle of the chip card 8 made up of a plurality of layers. The conductor track supporting layer 1 is covered on both sides by covering layers 15 and 16, respectively.

Depending on the construction and use of the chip cards, it is of course conceivable that, apart from the three layers represented in FIG. 4, further layers, for example printed information-carrier and protective-film layers, may be arranged on the rear side or front side, so that a chip card may also be made up of six or more individual layers in the course of a laminating process. The joining together of the individual layers takes place in this case by the influence of pressure and heat in a laminating press.

After the laminating operation, in which the card body 17 has been completed, in the latter a recess 12 must be made in the card body 17 for receiving electronic components, such as for example the chip module 11. This usually takes place by a milling operation, in which, according to the invention, the covering layer 15, and possibly further layers arranged over the latter, is partially milled away from that side which is remote from the conductor tracks 2 located in the interior of the card body 17, until the conductor track supporting layer 1 is reached, so that the recess 12 is produced. The depth of the recess 12 is dependent on the one hand on the thickness of the chip module 11, on the other hand it is clear from FIG. 4 that exposure of the connecting areas within the conductor track supporting layer 1 is necessary for the electrical bonding of the chip module 11 to these connecting areas 3 located within the card body 17. The given thickness of the connecting areas 3 makes it possible for them to be exposed without any problem in the course of the milling operation, without the recess having to be made so deep that the conductor tracks 2 additionally arranged on the conductor track supporting layer 1 can possibly be contacted in any way and possibly be damaged, as is often the case with the conductor tracks known so far from the prior art. On the chip module 11, there are usually contact areas 13 which are connected to the connecting areas 3 by means of a conductive adhesive, which under some circumstances serves at the same time for fixing the chip module 11 within the recess 12 of the chip card 8.

What is claimed is:

1. A chip card comprising:

a chip card body having at least one recess formed therein;

a conductor track supporting layer for laminating inside the chip card;

at least one conductor track connected to the conductor track supporting layer by a screen printing paste, or high-viscosity liquid; and at least one connecting area associated with each of said at least one conductor track wherein the conductor track supporting layer has, in the region of the connecting areas, indentations which are filled with the conductive paste, screen printing paste or the high-viscosity liquid, wherein the conductor track supporting layer is formed of a plurality of sublayers stacked atop each other and bonded to each other, wherein at least two of the sublayers each have at least one through-hole formed therein, wherein the through-hole of a first of the plurality of sublayers is in fluid communication with a through-hole formed in a second of the plurality of sublayers, wherein the at least one recess is adapted to receive a chip module and/or other electronic component, wherein the at least one recess is formed in a side of the conductor track supporting layer which is not coated with the at least one conductor track, and wherein the recess has a depth such that a bottom of the recess reaches far enough into the conductor track supporting layer that at least one of the indentations filled with screen printing paste are exposed to the recess.

2. The chip card as claimed in claim 1, wherein the indentations are made as through-holes with an opening on a rear side of the conductor track supporting layer opposite the at least one conductor track.

3. The chip card as claimed in claim 1, further comprising: a protective film provided on the rear side of the conductive track support layer.

4. The chip card as claimed in claim 1, wherein the at least one conductor track has the form and function of a coil.

5. The chip card as claimed in claim 1, wherein the screen printing paste has a silver particle content of between 70 and 80% percent by volume.

6. The chip card as claimed in claim 5, wherein the grain size of the silver particles is greater than 45 $\mu$m.

7. The chip card as claimed in claim 1, wherein the screen printing paste is conductive.

8. The chip card as claimed in claim 1, wherein the high-viscosity liquid is conductive.

* * * * *